United States Patent
Palmer et al.

(10) Patent No.: US 6,553,558 B2
(45) Date of Patent: Apr. 22, 2003

(54) INTEGRATED CIRCUIT LAYOUT AND VERIFICATION METHOD

(75) Inventors: Shane R. Palmer, Dallas, TX (US); John N. Randall, Richardson, TX (US); Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 229 days.

(21) Appl. No.: 09/737,680

(22) Filed: Dec. 14, 2000

(65) Prior Publication Data

US 2002/0078427 A1 Jun. 20, 2002

Related U.S. Application Data

(60) Provisional application No. 60/175,901, filed on Jan. 13, 2000.

(51) Int. Cl.$^7$ .............................................. G06F 17/50
(52) U.S. Cl. ............................ 716/19; 716/19; 716/21; 716/11
(58) Field of Search ........................... 716/19, 20, 21, 716/4, 5, 11

(56) References Cited

U.S. PATENT DOCUMENTS

| | | | | |
|---|---|---|---|---|
| 6,269,472 B1 | * | 7/2001 | Garza et al. | 716/21 |
| 6,275,971 B1 | * | 8/2001 | Levy et al. | 716/11 |
| 6,301,689 B1 | * | 10/2001 | Darden | 716/10 |
| 6,341,366 B1 | * | 1/2002 | Wang et al. | 716/11 |
| 6,374,395 B1 | * | 4/2002 | Wang | 716/11 |
| 6,415,421 B2 | * | 7/2002 | Anderson et al. | 716/19 |
| 6,425,113 B1 | * | 7/2002 | Anderson et al. | 716/19 |

* cited by examiner

*Primary Examiner*—Vuthe Siek
*Assistant Examiner*—Binh Tat
(74) *Attorney, Agent, or Firm*—Peter K. McLarty; W. James Brady, III; Frederick J. Telecky, Jr.

(57) ABSTRACT

A method of performing and verifying an integrated circuit layout is provided that comprises the steps of performing the layout of a mask. Proximity correction techniques are then applied to the mask layout data. Theoretical contours which comprise curvilinear forms are then extrapolated from the corrected mask data set. The curvilinear contour data is then bounded using boxing algorithms in order to generate a bounded contour data set. The bounded contour data set can then be compared to the original input mask data to detect design rule violations and other characteristics of the original layout.

14 Claims, 3 Drawing Sheets

INTEGRATED CIRCUIT LAYOUT AND VERIFICATION METHOD

This application claims priority under 35 USC §119(e)(1) of provisional application No. 60/175,901 filed Jan. 13, 2000.

TECHNICAL FIELD OF THE INVENTION

This invention relates in general to the field of manufacturing electronic devices and more particularly to an improved method for integrated circuit layout and verification.

BACKGROUND OF THE INVENTION

Integrated circuit designers are constantly striving to make the individual features within integrated circuits smaller so that the device density of the overall system can be improved. The photolithographic processes used to form devices in an integrated circuit have reached a point where the feature size is comparable or even smaller than the wavelength of the light used to transfer the mask pattern onto the photoresist used to create the features. In order for such a feature to be created under such conditions, the photo mask used to create the feature must be altered to correct for nonlinear behavior of light and etch interactions during the patterning of integrated circuits. This process is referred to as proximity correction and it occurs after the completion of the layout of the mask pattern. The theoretical mask pattern can be proximity corrected using an iterative process that accounts for the multitude of different interactions that cause distortions and variations from the desired pattern which is to be reproduced on the integrated circuit substrate. The interactions that cause these distortions include the limited band pass of the optical system to reproduce high spacial frequency mask components, optical variations and aberrations in the lens of the imaging system, reflectivity effects and local surface scattering variations of the image, standing wave effects, interference of light and local area background effects, thin film effects, resist development effects and etch loading effects.

The implementation of proximity correction methods can result in the alteration of the theoretical shapes within the mask. Borders of features can be expanded or contracted in order to account for the various effects discussed. This alteration of the borders of features can result in erroneous results when the altered mask is tested for various design rules and electrical characteristics.

SUMMARY OF THE INVENTION

Accordingly, a need has arisen for an integrated circuit layout verification technique that allows for the use of proximity correction but eliminates disadvantages associated with conventional methods of mask verification.

Accordingly, an integrated circuit layout mask verification method is provided that substantially eliminates or reduces disadvantages associated with conventional methods of applying proximity correction.

According to one embodiment of the present invention, a method is provided that comprises the steps of creating a data set defining a mask layout. This data set is then corrected using proximity correction algorithms. A data set is then generated comprising the theoretical contours of the features which would result from the use of the contour corrected mask data. This contour data set is then bounded. The bounded contour data set is then compared to the theoretical mask layout data and tested against various design rules.

An important technical advantage of the present invention inheres in the fact that it allows for the use of proximity correction methods but generates a bounded contour data set that can be used to check the layout for electrical efficacy and compliance with various design rules. In this manner, proximity correction can be used to avoid a failure of a theoretical layout which would not have been apparent with said layout prior to construction of the integrated circuit.

BRIEF DESCRIPTION OF THE DRAWINGS

A more complete understanding of the present invention may be acquired by referring to the accompanying figures in which like reference numbers indicate like features and wherein.

DETAILED DESCRIPTION OF THE INVENTION

Figure 1A:
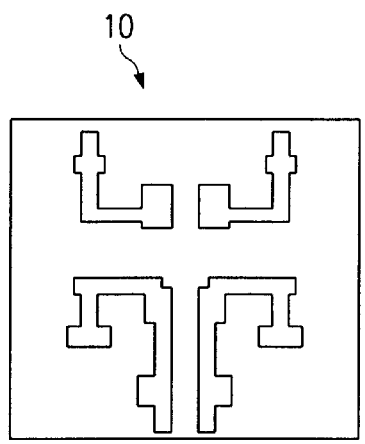
FIGS. 1A and 1B are schematic illustrations of an uncorrected and corrected mask.
Figure 1B:
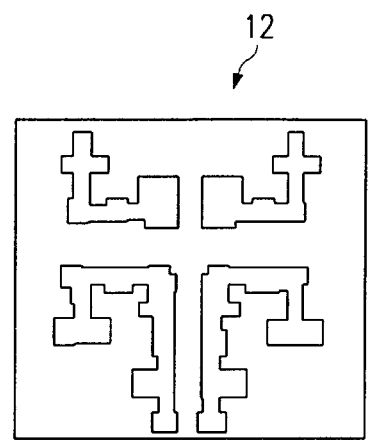

FIG. 1A illustrates a portion of an uncorrected mask indicated generally at 10. If the features within mask 10 are too small the structures indicated in mask 10 will not be accurately transcribed to the photoresist used in association with mask 10. As such, the features within mask 10 must be corrected to account for the various interactions which can cause inaccuracies during the transfer process. FIG. 1B illustrates a proximity corrected mask indicated generally at 12. As can be seen in FIG. 1B various portions of the features shown in mask 10 have been altered to correct for the inaccuracies in the transfer process. For example, certain features have been expanded. In addition, portions of long lines have been narrowed while others have been widened. These alterations in the features shown in mask 10 will provide greater accuracy in the transfer of the features to the photo resist used in conjunction with mask 12. In effect, the features shown in mask 12 will result in the transfer of a closer approximation of the features shown in mask 10 than the use of mask 10 itself.

One of the differences that can be noticed in the corrected pattern of mask 12 is that it contains more vertices. Mask 12 also contains smaller perimeter segments than the original pattern in mask 10. In addition, because of the enlargement of various features, mask 12 has smaller gaps between features. These differences between the proximity corrected mask 12 and the uncorrected mask 10 limit the ability to verify the layout of the integrated circuit prior to the construction of the mask. Masks must be checked to ensure that the features within a particular mask comply with various design rules and layout specifications. It is possible for a mask to fail a design rule or layout specification due to proximity correction effects as opposed to actual layout errors. This is due to the fact that proximity correction techniques can reduce or eliminate the spacing between features.

Figure 2:
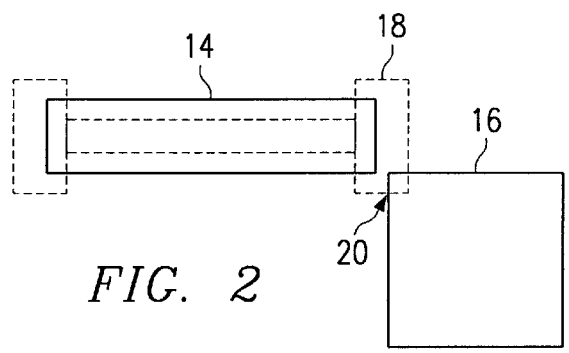
FIG. 2 is a schematic diagram illustrating the potential for error using a proximity corrected mask.

Referring to FIG. 2, an uncorrected feature 14 of a mask is shown proximate an uncorrected feature 16. If proximity correction techniques are applied to feature 14 the resulting mask feature will look like the corrected feature 18 shown in dashed lines in FIG. 2. As can be seen in FIG. 2 the corrected feature 18 overlaps with feature 16 at point 20 shown in FIG. 2. As such, the proximity correction techniques have created a layout error if the feature 16 and feature 14 are not intended to intersect. This is undesirable because the number of errors which are caused by proximity correction make it impossible to discern which are real device layout errors and which errors are introduced by the distortion of the pattern due to the proximity correction techniques. In order for a layout of a mask to be accurately tested, it is desirable to discern from the proximity corrected pattern what are real errors and what errors do not effect the electrical performance of the device. It is equally important to determine which of the errors are a result of the proximity correction routine and which are true layout errors.

Figure 3A:
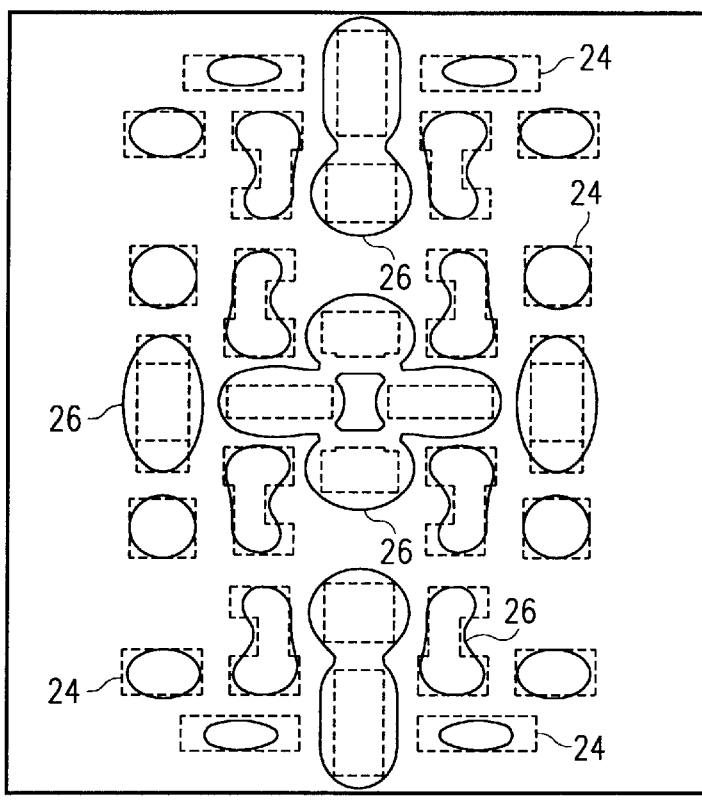
FIGS. 3A, B and C are schematic diagrams illustrating the theoretical corrected and contour data sets that are associated with the method of the present invention.
Figure 3B:
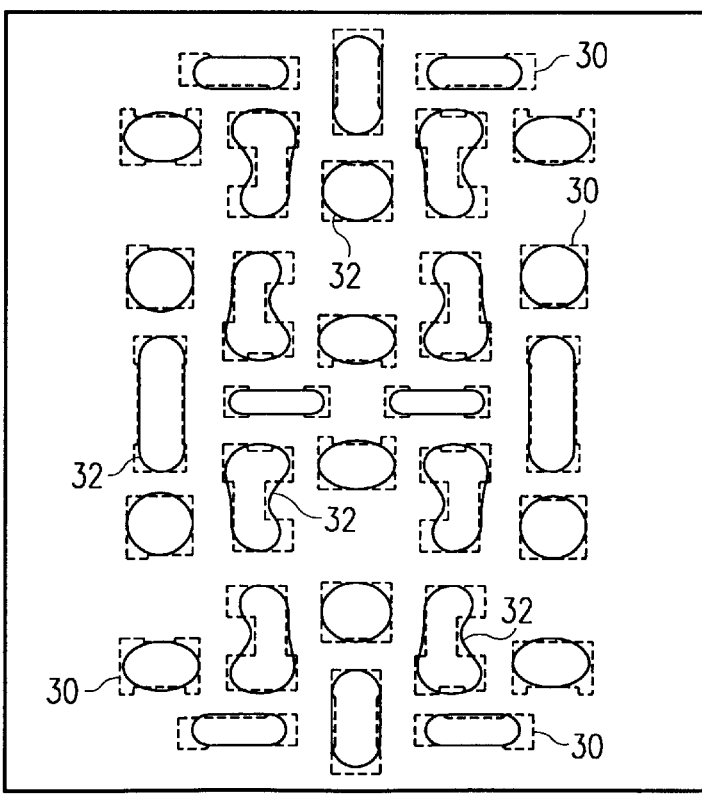
Figure 3C:
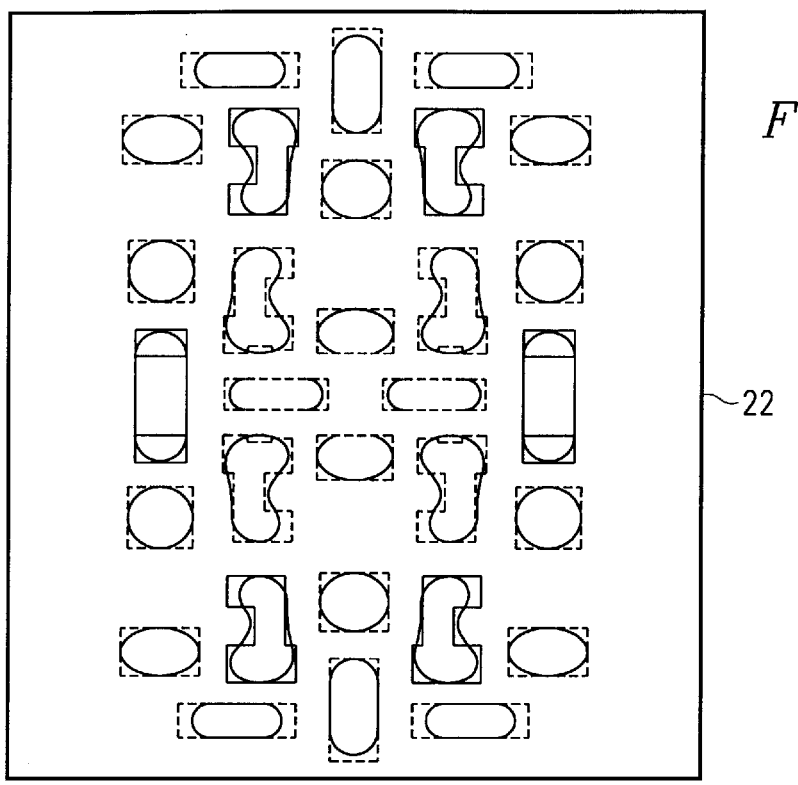

FIGS. 3A through 3C illustrate a method according to the teachings of the present invention which can be applied to a final proximity corrected layout to allow it to be compared to an original layout in a more accurate fashion.

Referring to FIG. 3A, an original mask 22 is shown which includes features such as feature 24 which a layout designer desires to be transferred to an integrated circuit layer. FIG. 3A also illustrates the contour such as contoured shape 26 associated with each of the features such as feature 24. The contoured shapes 26 are the result of processing of the data representing the uncorrected layout of mask 22. This processing results in a theoretical model of what would happen if the uncorrected mask 22 were to be used to create actual features in an integrated circuit. As such, the contours 26 represent a data set which models the actual result of photolithographic and etch processes using the uncorrected mask 22. As can be seen in FIG. 3A, the results as illustrated by contours 26 are not satisfactory in that they do not closely approximate the features within mask 22 such as feature 24. In a variety of cases the photolithographic and etch processes have greatly understated the desired scale of a feature and in other places in FIG. 3A the contours 26 are much larger than the desired feature.

FIG. 3B illustrates a proximity corrected mask 28 which includes proximity corrected features such as feature 30 which corresponds to feature 24 described previously with reference to FIG. 3A. FIG. 3B also illustrates contours such as contour 32 which corresponds to contour 26 described with reference to FIG. 3A. As discussed previously, FIG. 3B represents a data set associated with a corrected mask 28 including corrected features 30. Contours 32 also represent a data set which is the theoretical result of physical etch and photolithographic processes applied to the corrected mask 28. As can be seen in FIG. 3B, the contours such as contour 32 are much closer to the desired features such as feature 30 within mask 28. In contrast to FIG. 3A, the contours within FIG. 3B do not intersect one another and they are much closer to the boundaries of the desired features than the contours shown in FIG. 3A.

This is illustrated dramatically in FIG. 3C where the data set associated with the contours resulting from the corrected mask are overlaid onto the data defining the original input mask 22. Using the data sets represented in FIG. 3C, the method of the present invention can proceed to analyze the resulting contours for layout and other errors. As can be seen in FIG. 3C, the contours which are the theoretical results of physical etch and photolithographic processes are largely smooth curves such as ovals, circles and other curvilinear shapes. The data set representing these shapes is extremely large and would be extremely difficult to analyze. As such, according to the teachings of the present invention, the data set associated with the contours is adjusted using a suitable data simplification process. By way of example and not limitation, the curvilinear contour data set can be subjected to a suitable box algorithm where the data points within the contours are changed to create a data set defining a group of straight lines.

Figure 4:
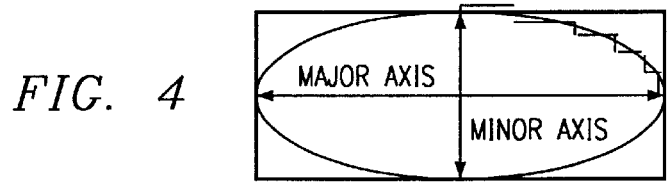
FIGS. 4 and 5 are schematic diagrams illustrating the bounding method used in the present invention.

FIG. 4 illustrates the application of one form of a box algorithm to a contour pattern comprising an oval. Referring to FIG. 4, the box algorithm operates on the contour and considers the slope of a line tangential to the contour to output a ninety degree segment. The length of the segments is adjusted depending upon the value of the slope of the tangent. The method shown in FIG. 4 results in only horizontal or vertical segments. A similar method can be used to also include forty-five degree segments to more closely approximate the curvilinear forms such as the ovals shown in FIG. 4. Whatever suitable approximation method is chosen, the final result will be a data set defining some form of polygon which represents and approximates the curvilinear contour. The segments that are generated by a box algorithm can be merged based on a minimum segment length in order to reduce the number of vertices and correspondingly reduce the amount of data in the resulting data set.

Figure 5:
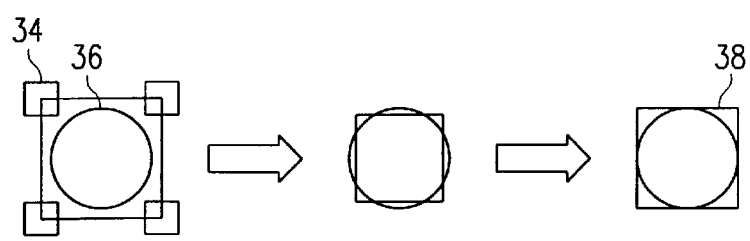

FIG. 5 illustrates a technique where the step of generating the simplified data set associated with the output contours can be combined with the step of creating the actual data set associated with the theoretical contours resulting from the proximity corrected mask. As shown in FIG. 5, a proximity corrected mask indicated generally at 34 will result in a theoretical contour 36. As before, the proximity corrected mask 34 is then used to generate theoretical contours of the patterns. By using the contours of the proximity corrected mask and the contour, a guide for moving the edges of the resulted structures can be discerned. The resultant output would be similar or identical to the output associated with the previously discussed method, however, the final input mask would have no increase in vertex count. In this manner, the boxing algorithm indicated generally at 38 in FIG. 5 can be combined with the step of creating the output contours. Specifically, in FIG. 5, moving from left to right the output proximity corrected pattern is shown overlaid with the contour that estimates how the pattern will transfer to the integrated circuit. Moving to the right, the second pattern shown is the same contour but overlaid with the input pattern prior to the correction. The reason why there is a difference between the contour diameter and the input pattern size is due to a sizing bias that is applied to the pattern, for example, etch bias or reticle bias in manufacturing. The third pattern in the sequence illustrates the same contour lying inside a bounding box. The bounding box shown in FIG. 5 can then be used to perform a variety of verifications on the layout. These verifications can include testing for electrical efficacy, design layout and spacing rules.

One approach to performing the comparison between the initial input and the bounded contour is to perform a boolean operation on the data set representing the initial input mask and the final bounded contour data set. This boolean may comprise a logical subtraction of the two patterns. This operation will result in a data set which is the error between the bounded contour and the intended pattern. This data center representing the errors between the desired and the predicted feature can be processed to highlight critical errors vs. non-critical errors. For example, if the area of an error structure was too large a percentage of the original structure the error structure could be highlighted to allow designer to adjust the original layout or adjust the proximity correction attributable to that feature. In this manner, a feature which is completely omitted will be highlighted or a feature that is reduced in size or overstated in size by too large of a degree will be highlighted.

Figure 6:
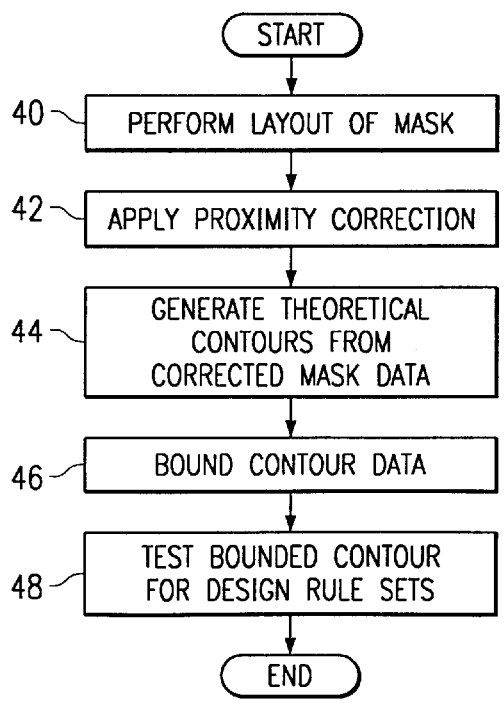
FIG. 6 is a flow chart illustrating a series of steps which may be used in one embodiment of the present invention.

FIG. 6 is a flow diagram illustrated the general process of the present invention. The method begins at step 40 where the layout of a mask associated with an integrated circuit layer is performed resulting in an initial mask data set defining the features within the mask layer. The method then proceeds to step 42 where conventional proximity correction techniques are applied to the data set created in step 40. This results in a new data set associated with proximity corrected features within the mask layer. The method then proceeds to step 44 where theoretical contours are constructed from the proximity corrected mask data. This results in a contour data set which defines curvilinear forms which would be created if the proximity corrected mask was actually used to construct an integrated circuit layer. The method then proceeds to step 46 where the contour data set is bounded to create a data set defining a set of polygons that approximates the curvilinear contours associated with the data created in step 44. The method then proceeds to step 48 where the bounded contour data set is tested for design rule and electrical design characteristics and violations. As discussed previously, this can be accomplished by performing a boolean comparison of the data set associated with the bounded contours with the initial theoretical layout of the mask created in step 40. As discussed with reference to FIG. 5 previously, steps 44 and 46 may be combined so that the process of creating the contour data can directly result in the creation of the simplified data set associated with polygons approximating the actual curva-linear contour forms.

Accordingly, a method is provided that allows for the efficient testing and verification of mask layouts after they have been subjected to proximity correction techniques. In this manner, the resultant structures from the proximity corrected masks are used to test the efficacy and character of the proximity corrected mask. In this manner, errors that result from the proximity correction techniques themselves can be filtered from the error analysis and layout verification process. Instead, the theoretical contours resulting from the proximity corrected mask are used to test the layout and electrical characteristics of the mask.

Although the present invention has been described in detail it should be understood that various changes, alterations and substitutions may be made to the teachings herein without departing from the spirit and scope of the present invention which is solely defined by the appended claims.

What is claimed is:

1. A method for constructing an integrated circuit comprising:

generating a mask layout data set associated with a desired set of features for a layer of an integrated circuit device;

generating from the mask layout data set a proximity corrected data set associated with proximity corrected features within the layer of the integrated circuit device;

generating a bounded contour data set from the proximity corrected data set, the bounded contour data set representing the theoretically predicted structures which would be formed using a mask constructed from the proximity corrected data set; and comparing the bounded contour data set with the mask layout data set and generating an error data set representative of the difference between the bounded contour data set and the mask layout data set.

2. The method of claim 1 and further comprising the step of generating a curvilinear contour data set using the proximity corrected mask data set, the curvilinear contour data set representing curvilinear forms that would be formed using a mask constructed from the proximity corrected data set.

3. The method of claim 1 and further comprising the step of comparing the bounded contour data set with the mask layout data set using a boolean operation to generate an error data set.

4. The method of claim 3 wherein the boolean operation comprises a logical subtraction of the bounded contour data set from the mask layout data set.

5. The method of claim 1 and further comprising the step of testing the bounded contour data set against design rule parameters associated with the character and spacing of features within an integrated circuit layer and generating a design rule violation data set identifying portions of the bounded contour data set associated with features that violate the design rule parameters.

6. The method of claim 1 wherein the step of generating the bounded contour data set comprises the steps of:

generating a curvilinear contour data set using the proximity corrected data set, the curvilinear contour data set representative of curvilinear forms which would be created using a mask created using the proximity corrected data set; and generating a bounded contour data set by applying a box approximation to the curvilinear contour data set to generate a data set representative of a plurality of polygons approximating the curvilinear forms comprising the curvilinear contour data set.

7. The method of claim 6 wherein the box approximation process comprises the step of approximating the curvilinear forms using horizontal and vertical segments having lengths associated with the slope of associated tangents to the curvilinear form.

8. The method of claim 6 wherein the box approximating algorithm comprises the step of forming polygons comprising vertical, horizontal and diagonal segments approximating the curvilinear forms.

9. A method for constructing an integrated circuit comprising:

generating a mask layout data set associated with a desired set of features for a layer of an integrated circuit device;

generating from the mask layout data set a proximity corrected data set associated with proximity corrected features within the layer of the integrated circuit device;

generating a curvilinear contour data set using the proximity corrected mask data set, the curvilinear contour data set representing curvilinear forms that would be formed using a mask constructed from the proximity corrected data set;

generating a bounded contour data set from the curvilinear contour data set;

comparing the bounded contour data set with the mask layout data set and generating an error data set representative of the difference between the bounded contour data set and the mask layout data set; and testing the bounded contour data set against design rule parameters associated with the character and spacing of features within an integrated circuit layer and generating a design rule violation data set identifying portions of the bounded contour data set associated with features that violate the design rule parameters.

10. The method of claim 9 and further comprising the step of comparing the bounded contour data set with the mask layout data set using a boolean operation to generate an error data set.

11. The method of claim 10 wherein the boolean operation comprises a logical subtraction of the bounded contour data set from the mask layout data set.

12. The method of claim 10 wherein the step of generating the bounded contour data set comprises the step of generating a bounded contour data set by applying a box approximation to the curvilinear contour data set to generate a data set representative of a plurality of polygons approximating the curvilinear forms comprising the curva-linear contour data set.

13. The method of claim 12 wherein the box approximation process comprises the step of approximating the curvilinear forms using horizontal and vertical segments having lengths associated with the slope of the tangent to the curvilinear form.

14. The method of claim 12 wherein the box approximating algorithm comprises the step of forming polygons comprising vertical, horizontal and diagonal segments approximating the curvilinear forms.

* * * * *